United States Patent
Smith

(10) Patent No.: US 11,605,724 B2
(45) Date of Patent: *Mar. 14, 2023

(54) SEMICONDUCTOR DEVICE

(71) Applicant: KABUSHIKI KAISHA TOSHIBA, Tokyo (JP)

(72) Inventor: Matthew David Smith, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 28 days.

This patent is subject to a terminal disclaimer.

(21) Appl. No.: 17/305,464

(22) Filed: Jul. 8, 2021

(65) Prior Publication Data

US 2022/0336624 A1    Oct. 20, 2022

(30) Foreign Application Priority Data

Apr. 15, 2021    (JP) .............................. JP2021-068881

(51) Int. Cl.
*H01L 29/778* (2006.01)
*H01L 29/49* (2006.01)
(Continued)

(52) U.S. Cl.
CPC ...... *H01L 29/518* (2013.01); *H01L 29/41775* (2013.01); *H01L 29/4966* (2013.01); *H01L 29/7786* (2013.01)

(58) Field of Classification Search
CPC ............. H01L 29/7786; H01L 29/4236; H01L 29/42364
See application file for complete search history.

(56) References Cited

U.S. PATENT DOCUMENTS 9,257,519 B2    2/2016    Chudzik et al.
2010/0044805 A1    2/2010    Callegari et al.
(Continued)

OTHER PUBLICATIONS

Gao et al., "Band alignments and improved leakage properties of $(La_2O_3)_{0.5}(SiO_2)_{0.5}/SiO_2/GaN$ stacks for high-temperature metal-oxide-semiconductor field-effect transistor applications", Applied Physics Letters 94, 252901, 2009, 4 pages.
(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

According to one embodiment, a semiconductor device includes a first semiconductor region, a first electrode, and a first insulating member. The first semiconductor region includes $Al_{z1}Ga_{1-z1}N$ ($0 \leq z1 < 1$). The first semiconductor region includes a first partial region. The first insulating member includes a first insulating portion between the first partial region and the first electrode. The first insulating portion includes a first insulating region and a second insulating region. The second insulating region is provided between the first insulating region and the first electrode. The first insulating region includes $Al_{1-x1}Si_{x1}O$ ($x1 < 0.5$). The second insulating region includes $Al_{1-x2}Si_{x2}O$ ($0.5 < x2$).

20 Claims, 9 Drawing Sheets

(51) Int. Cl.
  *H01L 29/51* (2006.01)
  *H01L 29/417* (2006.01)

(56) References Cited

U.S. PATENT DOCUMENTS

| | | | |
|---|---|---|---|
| 2013/0252386 A1 | 9/2013 | Sheppard et al. | |
| 2013/0279259 A1 | 10/2013 | Forbes et al. | |
| 2014/0322923 A1 | 10/2014 | Forbes et al. | |
| 2016/0087064 A1 | 3/2016 | Ohashi et al. | |
| 2018/0248016 A1 | 8/2018 | Shimizu et al. | |
| 2019/0081164 A1 | 3/2019 | Shrivastava | |
| 2022/0190150 A1* | 6/2022 | Smith | H01L 29/66462 |
| 2022/0293754 A1* | 9/2022 | Inokuchi | H01L 29/7813 |

OTHER PUBLICATIONS

Yamada et al., "Improved interface properties of GaN-based metal-oxide-semiconductor devices with thin Ga-oxide interlayers", Applied Physics Letters 110, 261603, 2017, 6 pages.

Watanabe et al., "$SiO_2$/AlON stacked gate dielectrics for AlGaN/GaN MOS heterojunction field-effect transistors", Japanese Journal of Applied Physics 57, 06KA03, 2018, 7 pages.

Wang et al., "Band alignment of $TiN/HfO_2$ interface of $TiN/HfO_2/SiO_2$/Si stack", Applied Physics Letters 100, 102906, 2012, 6 pages.

Hjalmarson et al., "Modeling the Influence of Defects on the Electrical Response of Multi-Dielectric Gate-Stack Structures", ECS Transactions, 19 (1), The Electrochemical Society, 2009, 7 pages.

Matys et al., "Origin of positive fixed charge at insulator/AlGaN interfaces and its control by AlGaN composition", Applied Physics Letters 110, 243505, 2017, 6 pages.

Jensen et al., "X-ray Reflectivity Characterization of $ZnO/Al_2O_3$ Multilayers Prepared by Atomic Layer Deposition", Chem. Mater., vol. 14, No. 5, 2002, pp. 2276-2282.

Sintonen et al., "X-ray reflectivity characterization of atomic layer deposition $Al_2O_3/TiO_2$ nanolaminates with ultrathin bilayers", Journal of Vacuum Science & Technology A 32, 01A111, 2014, 5 pages.

Greeuw et al., "The mobility of Na+, Li+, and K+ ions in thermally grown $SiO_2$ films", Journal of Applied Physics 56, 2218, 1984, 8 pages.

Ruzzarin et al., "Instability of Dynamic—$R_{ON}$ and Threshold Voltage in GaN-on-GaN Vertical Field-Effect Transistors", IEEE Transactions on Electron Devices, vol. 64, No. 8, Aug. 2017, 6 pages.

Filatova et al., "Inhibition of Oxygen Scavenging by TiN at the $TiN/SiO_2$ Interface by Atomic-Layer-Deposited $Al_2O_3$ Protective Interlayer", The Journal of Physical Chemistry C, 123, 2019, pp. 22335-22344.

* cited by examiner

SEMICONDUCTOR DEVICE

CROSS-REFERENCE TO RELATED APPLICATIONS

This application is based upon and claims the benefit of priority from Japanese Patent Application No. 2021-068881, filed on Apr. 15, 2021; the entire contents of which are incorporated herein by reference.

FIELD

Embodiments described herein relate generally to a semiconductor device.

BACKGROUND

For example, there are semiconductor devices such as transistors using nitride semiconductors. Stable characteristics are desired in semiconductor devices.

DETAILED DESCRIPTION

Figure 1A:
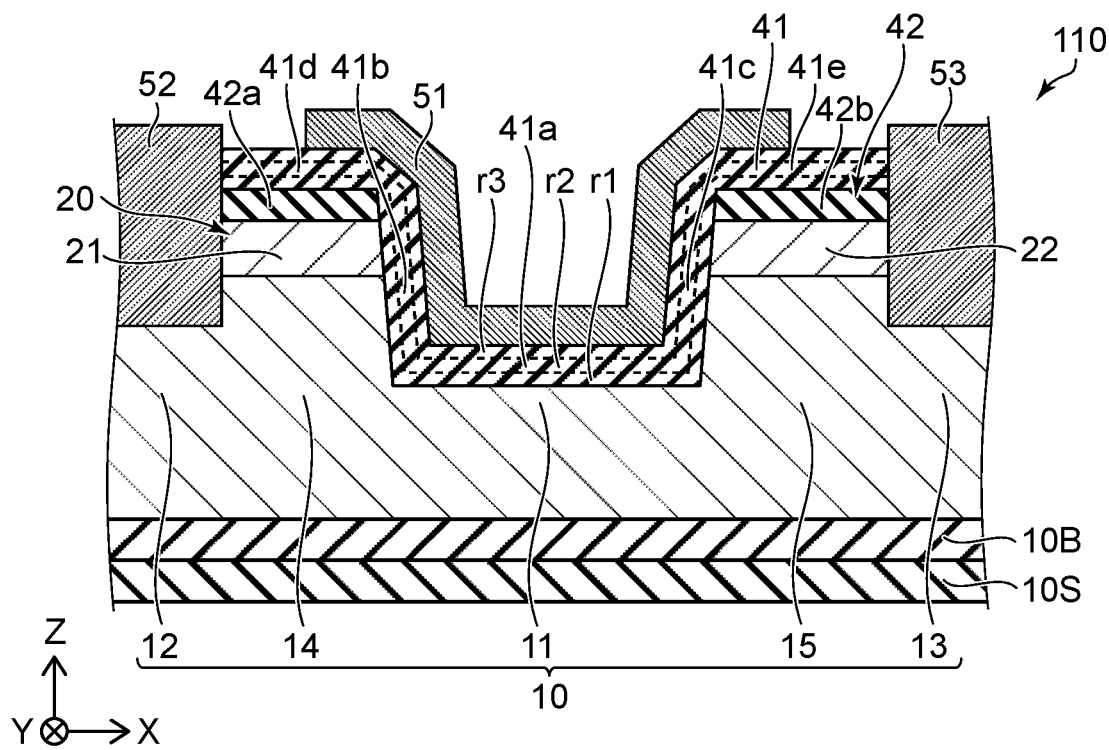
FIGS. 1A and 1B are schematic cross-sectional views illustrating the semiconductor device according to the first embodiment.

According to one embodiment, a semiconductor device includes a first semiconductor region, a first electrode, and a first insulating member. The first semiconductor region includes $Al_{z1}Ga_{1-z1}N$ (0≤z1<1). The first semiconductor region includes a first partial region. The first insulating member includes a first insulating portion between the first partial region and the first electrode. The first insulating portion includes a first insulating region and a second insulating region. The second insulating region is provided between the first insulating region and the first electrode. The first insulating region includes $Al_{1-x1}Si_{x1}O$ (x1<0.5). The second insulating region includes $Al_{1-x2}Si_{x2}O$ (0.5<x2).

According to one embodiment, a semiconductor device includes a first semiconductor region, a first electrode, and a first insulating member. The first semiconductor region includes $Al_{x1}Ga_{1-x1}N$ (0≤x1<1). The first semiconductor region includes a first partial region 11. The first insulating member includes a first insulating portion provided between the first partial region and the first electrode. The first insulating portion includes a first insulating region and a second insulating region. The second insulating region is provided between the first insulating region and the first electrode. The first insulating region includes $Al_{1-x1}Si_{x1}O_{y1}N_{1-y1}$ (x1<0.5, y1<0.5). The second insulating region includes $Al_{1-x2}Si_{x2}O_{y2}N_{1-y2}$ (0.5<x2, 0.5<y2).

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
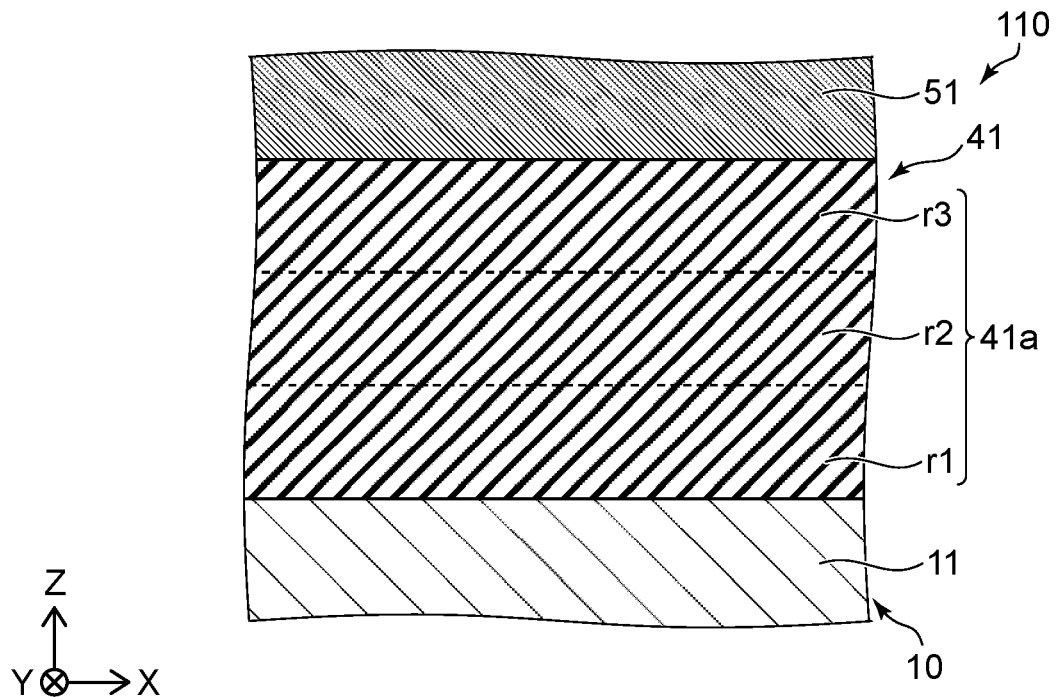

FIGS. 1A and 1B are schematic cross-sectional views illustrating the semiconductor device according to the first embodiment.

FIG. 1B is an enlarged view of FIG. 1A. As shown in FIG. 1A, the semiconductor device 110 according to the embodiment includes a first semiconductor region 10, a first electrode 51, and a first insulating member 41.

The first semiconductor region 10 includes $Al_{z1}Ga_{1-z1}N$ (0≤z1<1). The composition ratio z1 is, for example, not less than 0 and not more than 0.1. The first semiconductor region 10 includes, for example, GaN. The first semiconductor region 10 includes the first partial region 11.

The first insulating member 41 includes the first insulating portion 41a. The first insulating portion 41a is provided between the first partial region 11 and the first electrode 51.

A direction from the first partial region 11 to the first electrode 51 is the Z-axis direction. A direction perpendicular to the Z-axis direction is defined as the X-axis direction. A direction perpendicular to the Z-axis direction and the X-axis direction is defined as the Y-axis direction. The Z-axis direction corresponds to the stacking direction of the first partial region 11, the first insulating portion 41a, and the first electrode 51.

As shown in FIG. 1B, the first insulating portion 41a includes a first insulating region r1 and a second insulating region r2. The second insulating region r2 is provided between the first insulating region r1 and the first electrode 51. The first insulating region r1 includes $Al_{1-x1}Si_{x1}O$ (x1<0.5). The second insulating region r2 includes $Al_{1-x2}Si_{x2}O$ (0.5<x2). The first insulation region r1 includes, for example, Al-rich AlSiO. The second insulating region r2 includes, for example, Si-rich AlSiO.

In this example, the first insulating region r1 is in contact with the first partial region 11. As will be described later, a region having a high Al composition ratio (for example, an AlN region) may be provided between the first partial region 11 and the first insulating region r1.

By providing the first insulating region r1 and the second insulating region r2, more stable characteristics can be obtained in the semiconductor device. For example, high thermal stability can be obtained. For example, more stable characteristics can be obtained with respect to frequency. For example, the interface state in the region including between the first partial region 11 and the first insulating region r1 can be reduced. This provides high stability. For, example, high stability with respect to frequency and temperature can be obtained.

As shown in FIG. 1B, the first insulating portion 41a may include the third insulating region r3. The third insulating region r3 is provided between the second insulating region r2 and the first electrode 51. The third insulating region r3 includes silicon and oxygen. The third insulating region r3 does not include aluminum. Alternatively, the composition ratio of aluminum in the third insulating region r3 is lower than the composition ratio of aluminum in the second insulating region r2. The third insulating region r3 includes, for example, $SiO_2$. By providing such a third insulating region r3, for example, a high breakdown voltage can be easily obtained. For example, the leakage current can be suppressed.

As shown in FIG. 1A, in this example, the semiconductor device 110 includes a second electrode 52, a third electrode 53, and a second semiconductor region 20. The second semiconductor region 20 includes $Al_{z2}Ga_{1-z2}N$ ($z1 < z2 \leq 1$). The composition ratio z2 is, for example, not less than 0.15 and not more than 0.8. The second semiconductor region 20 includes, for example, AlGaN.

The direction from the second electrode 52 to the third electrode 53 is along the first direction. The first direction is, for example, along the X-axis direction. The position of the first electrode 51 in the first direction is between the position of the second electrode 52 in the first direction and the position of the third electrode 53 in the first direction.

The first semiconductor region 10 further includes a second partial region 12, a third partial region 13, a fourth partial region 14, and a fifth partial region 15. The direction from the second partial region 12 to the second electrode 52 is along the second direction. The second direction crosses the first direction. The second direction is, for example, the Z-axis direction. The direction from the third partial region 13 to the third electrode 53 is along the second direction. The position of the fourth partial region 14 in the first direction (X-axis direction) is between the position of the second partial region 12 in the first direction and the position of the first partial region 11 in the first direction. The position of the fifth partial region 15 in the first direction is between the position of the first partial region 11 in the first direction and the position of the third partial region 13 in the first direction.

The second semiconductor region 20 includes the first semiconductor portion 21 and the second semiconductor portion 22. The direction from the fourth partial region 14 to the first semiconductor portion 21 is along the second direction (Z-axis direction). The direction from the fifth partial region 15 to the second semiconductor portion 22 is along the second direction.

For example, the current flowing between the second electrode 52 and the third electrode 53 can be controlled by the potential of the first electrode 51. The electric potential is, for example, an electric potential based on the electric potential of the second electrode 52. For example, the distance between the second electrode 52 and the first electrode 51 is shorter than the distance between the first electrode 51 and the third electrode 53. For example, the first electrode 51 is a gate electrode. The second electrode 52 is a source electrode. The third electrode 53 is a drain electrode. The semiconductor device 110 is, for example, a transistor.

For example, a carrier region (for example, two-dimensional electron gas) is formed in the vicinity of the interface between the first semiconductor region 10 and the second semiconductor region 20. The semiconductor device 110 is, for example, HEMT (High Electron Mobility Transistor).

As shown in FIG. 1A, the semiconductor device 110 may include the substrate 10S. The substrate 10S is, for example, a substrate (for example, a silicon substrate or a SiC substrate). The semiconductor device 110 may include a nitride semiconductor region 10B. The nitride semiconductor region 10B is, for example, between the substrate 10S and the first semiconductor region 10. The nitride semiconductor region 10B, the first semiconductor region 10 and the second semiconductor region 20 are provided on the substrate 10S in this order.

As shown in FIG. 1A, the semiconductor device 110 may include a second insulating member 42. The second insulating member 42 includes silicon and nitrogen. The second insulating member 42 includes, for example, SiN. The first semiconductor portion 21 is located between the fourth partial region 14 and a part 42a of the second insulating member 42 in the second direction (Z-axis direction). The second semiconductor portion 22 is located between the fifth partial region 15 and another portion 42b of the second insulating member 42 in the second direction. By providing the second insulating member 42, for example, the second semiconductor region 20 is protected.

As shown in FIG. 1A, at least a part of the first insulating portion 41a is between the fourth partial region 14 and the fifth partial region 15 in the first direction (X-axis direction). In this example, at least a part of the first electrode 51 is between the fourth partial region 14 and the fifth partial region 15 in the first direction (X-axis direction). With such a configuration, for example, a high threshold voltage can be easily obtained. The first electrode 51 is, for example, a recess type (or trench type) gate electrode.

As shown in FIG. 1A, in this example, the first insulating member 41 includes a second insulating portion 41b and a third insulating portion 41c. A part of the second insulating portion 41b is between the fourth partial region 14 and the first electrode 51 in the first direction (X-axis direction). A part of the third insulating portion 41c is between the first electrode 51 and the fifth partial region 15 in the first direction.

For example, another part of the second insulating portion 41b is between the first semiconductor portion 21 and the first electrode 51 in the first direction (X-axis direction). Another portion of the third insulating portion 41c is between the first electrode 51 and the second semiconductor portion 22 in the first direction.

Each of the second insulating portion 41b and the third insulating portion 41c may have the same configuration as the first insulating portion 41a. For example, each of the second insulating portion 41b and the third insulating portion 41c may include the first insulating region r1 and the second insulating region r2. For example, each of the second insulating portion 41b and the third insulating portion 41c may include the third insulating region r3.

The first insulating member 41 may include a fourth insulating portion 41d and a fifth insulating portion 41e. A part 42a of the second insulating member 42 is between the first semiconductor portion 21 and the fourth insulating portion 41d. Another part 42b of the second insulating member 42 is between the second semiconductor portion 22 and the fifth insulating portion 41e.

Each of the fourth insulating portion 41d and the fifth insulating portion 41e may have the same configuration as the first insulating portion 41a. For example, each of the fourth insulating portion 41d and the fifth insulating portion 41e may include the first insulating region r1 and the second insulating region r2. For example, each of the fourth insulating portion 41d and the fifth insulating portion 41e may include the third insulating region r3.

Figure 2A:
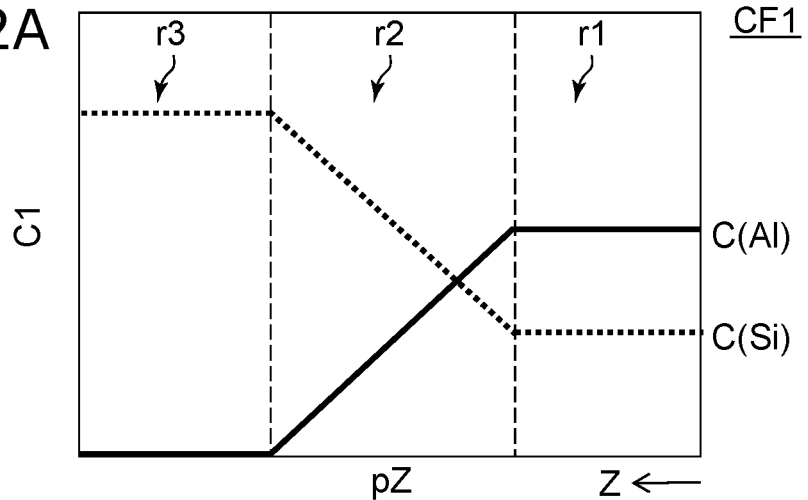
FIGS. 2A to 2C are schematic views illustrating the semiconductor device according to the first embodiment.
Figure 2B:
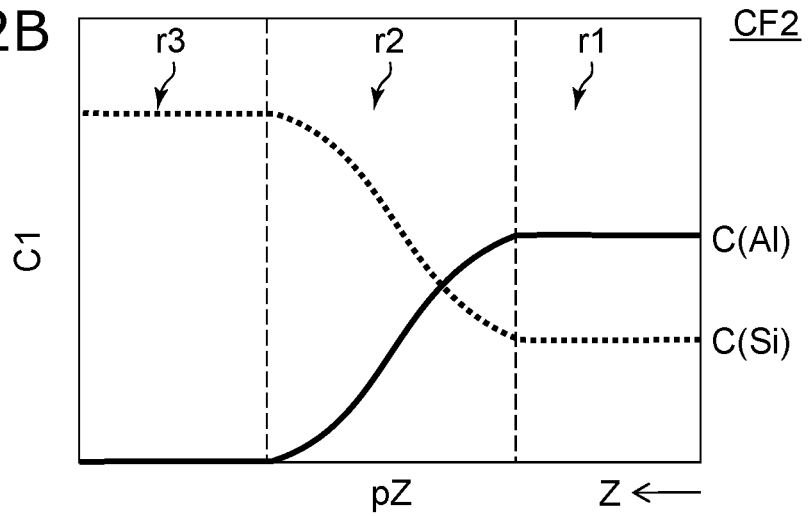
Figure 2C:
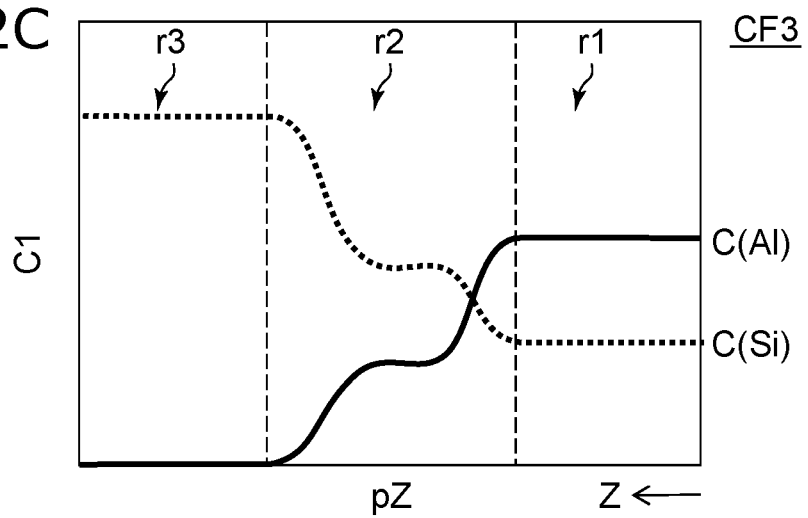

FIGS. 2A to 2C are schematic views illustrating the semiconductor device according to the first embodiment.

These figures exemplify the composition ratio in the first insulating portion 41a. The horizontal axis of these figures is the position pZ in the Z-axis direction. The vertical axis is the composition ratio C1 of Al or Si. In these figures, the composition ratio C (Al) of Al and the composition ratio C (Si) of Si are shown.

As shown in FIG. 2A, in the first configuration CF1, the composition ratio C (Al) in the second insulating region r2 is lower than the composition ratio C (Al) in the first insulating region r1. The composition ratio C (Al) in the third insulating region r3 is lower than the composition ratio C (Al) in the second insulating region r2. The composition ratio C (Si) in the second insulating region r2 is higher than the composition ratio C (Si) in the first insulating region r1. The composition ratio C (Si) in the third insulating region r3 is higher than the composition ratio C (Si) in the second insulating region r2. In the first configuration, the composition ratio C (Al) and the composition ratio C (Si) are substantially constant in the region including the first insulation region r1. In the region including the third insulating region r3, the composition ratio C (Al) and the composition ratio C (Si) are substantially constant. The composition ratio C (Al) and the composition ratio C (Si) change continuously between the first insulating region r1 and the third insulating region r3. In this example, the composition ratio changes linearly in the Z-axis direction.

As shown in FIG. 2B, in the second configuration CF2, the composition ratio C (Al) and the composition ratio C (Si) change smoothly and continuously. The continuous change in composition ratio makes it easier to suppress defects, for example.

As shown in FIG. 2C, in the third configuration CF3, the composition ratio C (Al) and the composition ratio C (Si) are substantially constant in a part of the second insulating region r2. For example, the composition ratio C (Al) and the composition ratio C (Si) change smoothly and continuously between the first insulating region r1 and the second insulating region r2. For example, the composition ratio C (Al) and the composition ratio C (Si) change smoothly and continuously between the second insulating region r2 and the third insulating region r3.

As described above, in the embodiment, at least one of the aluminum composition ratio C (Al) or the silicon composition ratio C (Si) may change continuously between the first insulating region r1 and the second insulating region r2.

In the embodiment, at least one of the aluminum composition ratio (Al) or the silicon composition ratio C (Si) may change continuously between the second insulating region r2 and the third insulating region r3.

Figure 3A:
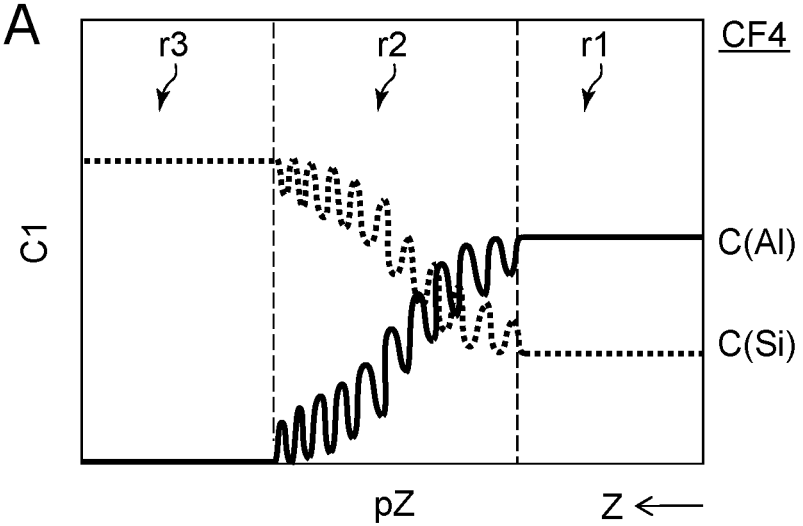
FIGS. 3A and 3B are schematic views illustrating the semiconductor device according to the first embodiment.
Figure 3B:
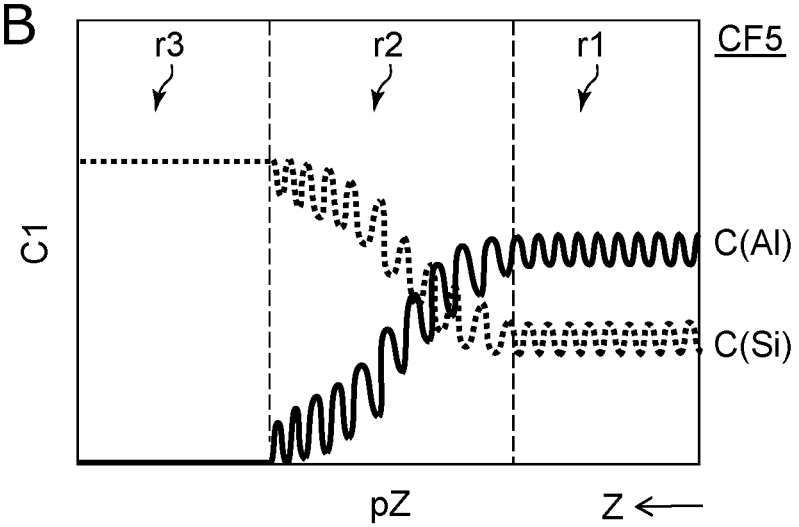

FIGS. 3A and 3B are schematic views illustrating the semiconductor device according to the first embodiment.

These figures exemplify the composition ratio in the first insulating portion 41a. The horizontal axis of these figures is the position pZ in the Z-axis direction. The vertical axis is the composition ratio C1 of Al or Si.

As shown in FIG. 3A, in the fourth configuration CF4, the composition ratio C (Al) and the composition ratio C (Si) repeatedly increase and decrease between the first insulating region r1 and the third insulating region r3. Thus, at least one of the aluminum composition ratio C (Al) in the second insulating region r2 or the silicon composition ratio C (Si) in the second insulating region r2 may repeat an increase and a decrease along the Z-axis direction (in the direction from the first partial region 11 to the first electrode 51).

As shown in FIG. 3B, in the fifth configuration CF5, the composition ratio C (Al) and the composition ratio C (Si) repeatedly increase and decrease in the first insulation region r1. Thus, at least one of the aluminum composition ratio C (Al) in the first insulating region r1 or the silicon composition ratio C (Si) in the first insulating region r1 may repeat an increase and decrease in the Z-axis direction (in the direction from the first partial region 11 to the first electrode 51).

The characteristics of the configuration CF1 to the configuration CF5 may be obtained, for example, depending on the degree of diffusion of the elements. These properties may be distinguished, for example, by resolution that depends on the analytical method for composition ratio.

Figure 4:
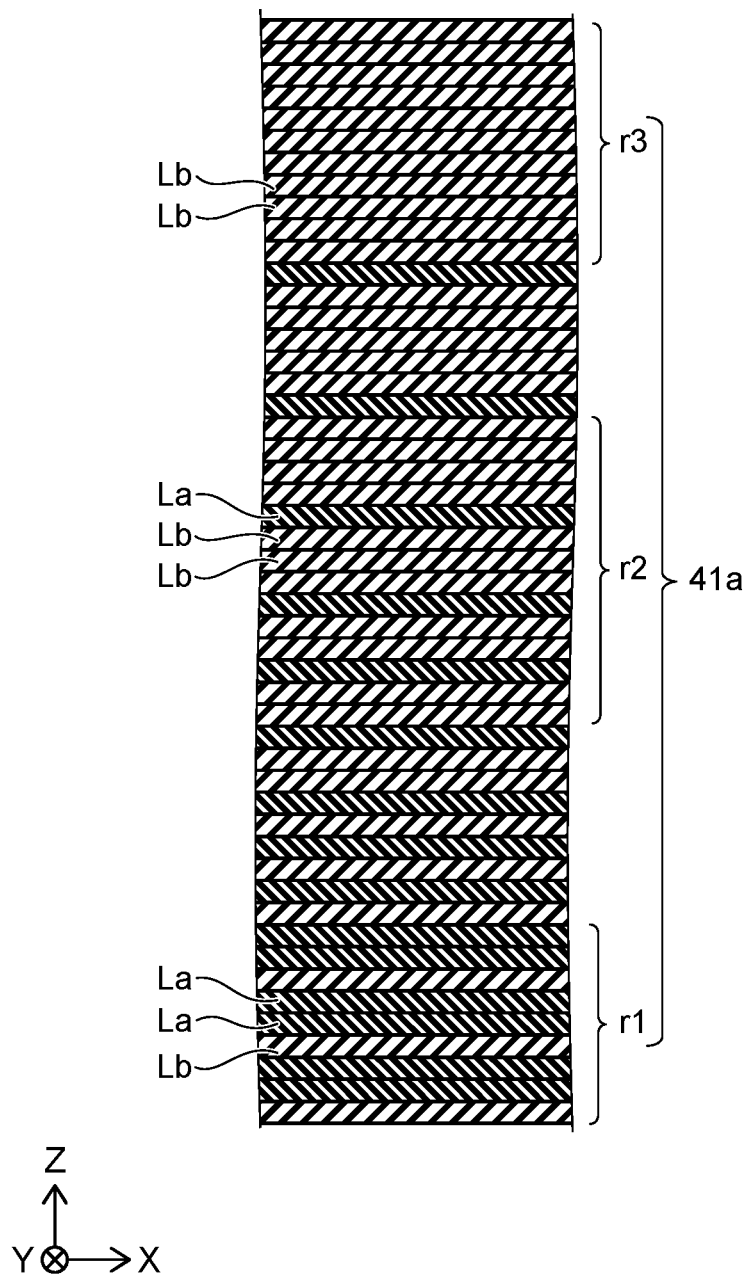
FIG. 4 is a schematic cross-sectional view illustrating the semiconductor device according to the first embodiment.

FIG. 4 is a schematic cross-sectional view illustrating semiconductor device according to the first embodiment.

FIG. 4 shows one example of the first insulating portion 41a. As shown in FIG. 4, at least a part of the first insulating portion 41a may include a plurality of first layer La and a plurality of second layer Lb. The plurality of first layer La includes, for example, aluminum and oxygen. The plurality of second layers Lb include, for example, silicon and oxygen. Each of the plurality of first layers La may be formed by, for example, ALD (Atomic Layer Deposition). Each of the plurality of second layers Lb may be formed by, for example, ALD. For example, the composition ratio of Al and Si can be changed by changing the density of the first layer La and the density of the second layer Lb.

In such a configuration, for example, the configuration exemplified in the fourth configuration CF4 or the fifth configuration CF5 may be obtained.

Examples of the characteristics of the semiconductor device will be described below.

Figure 5:
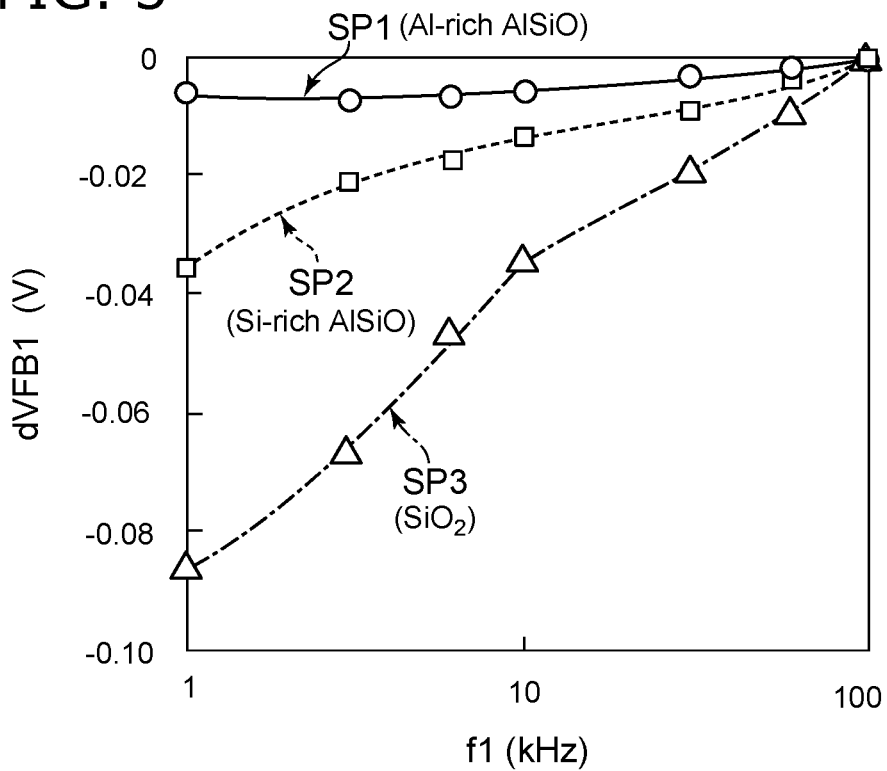
FIG. 5 is a graph illustrating the characteristics of the semiconductor device.

FIG. 5 is a graph illustrating the characteristics of the semiconductor device.

FIG. 5 illustrates the characteristics of the first sample SP1, the second sample SP2, and the third sample SP3. In the first sample SP1, the first insulating portion 41a is Al-rich $Al_{1-xa}Si_{xa}O$. In the first sample SP1, the composition ratio xa is 0.42. In the second sample SP2, the first insulating portion 41a is Si-rich $Al_{1-xa}Si_{xa}O$. In the second sample SP2, the composition ratio xa is 0.58. In the third sample SP3, the first insulating portion 41a is $SiO_2$. The horizontal axis of FIG. 5 is the frequency f1. The vertical axis is the change dVFB1 of the flat band voltage. The change dVFB1 corresponds to the difference between the flat band voltage measured at a certain frequency f1 and the flat band voltage measured at 100 kHz.

As shown in FIG. 5, in the third sample SP3, the change in the flat band voltage dVFB1 changes greatly depending on the frequency f1. In the first sample SP1, the change in the flat band voltage and the change in the frequency f1 of the dVFB1 are very small. In the second sample SP2, the change in flat band voltage due to the frequency f1 of dVFB1 is between the first sample SP1 and the third sample SP3.

As described above, in Al-rich AlSiO, the frequency dependence of the flat band voltage change dVFB1 is small.

For example, Al-rich AlSiO suppresses defects in the region between the first insulating portion 41a and the first semiconductor region 10. It is considered that the frequency dependence of the change dVFB1 of the flat band voltage becomes smaller by suppressing the defect.

Figure 6:
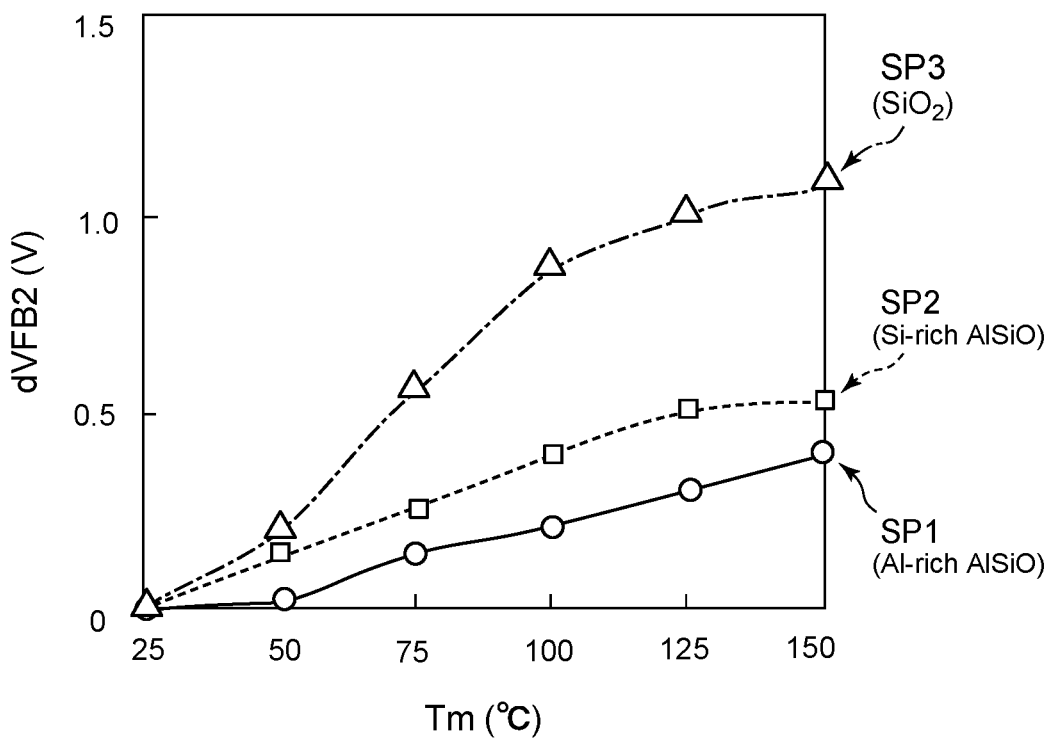
FIG. 6 is a graph illustrating the characteristics of the semiconductor device.

FIG. 6 is a graph illustrating the characteristics of the semiconductor device.

FIG. 6 illustrates the characteristics of the first sample SP1, the second sample SP2, and the third sample SP3. The horizontal axis of FIG. 6 is the temperature Tm. The vertical axis is the change dVFB2 between the flat band voltage at the temperature Tm and the flat band voltage at 25° C.

As shown in FIG. 6, in the third sample SP3, the difference dVFB2 is large. In the third sample SP3, the change in the flat band voltage is very large. In the first sample SP1, the difference dVFB2 is small. The difference dVFB2 in the second sample SP2 is between the first sample SP1 and the third sample SP3.

As described above, in Al-rich AlSiO, the temperature dependence of the change in the flat band voltage is small.

Since the insulating region in contact with the first semiconductor region 10 has a high Al composition ratio, high stability with respect to frequency changes can be obtained. Since the insulating region in contact with the first semiconductor region 10 has a high Al composition ratio, high stability with respect to changes in temperature can be obtained.

Figure 7:
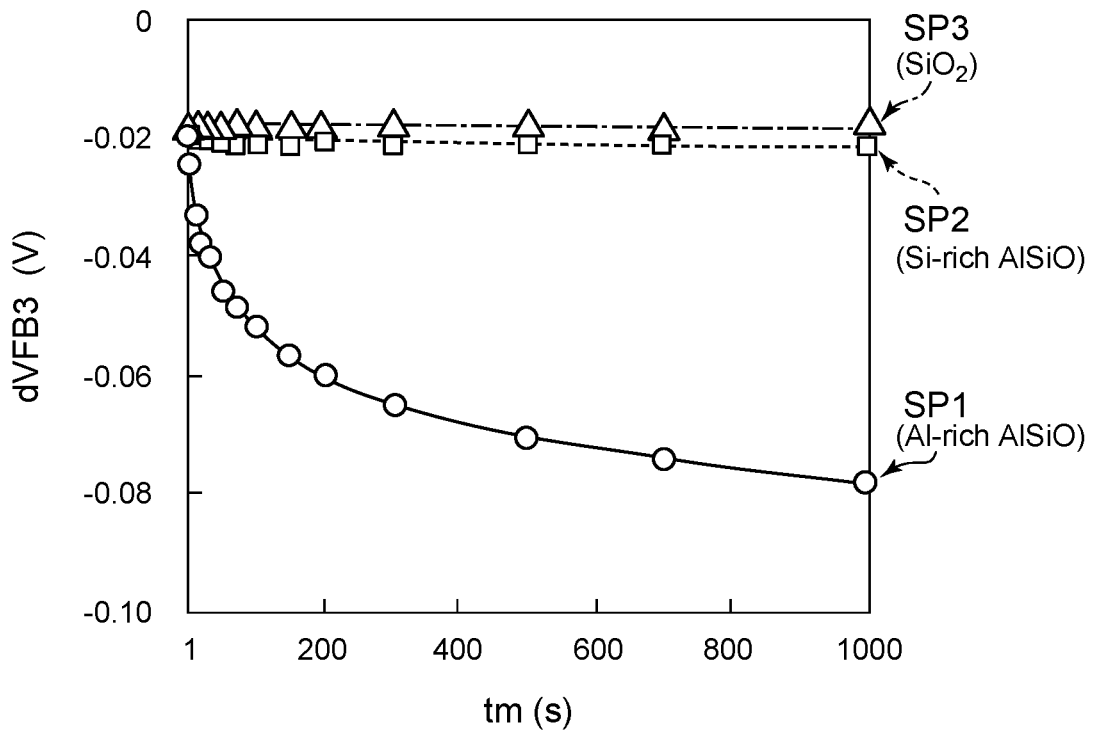
FIG. 7 is a graph illustrating the characteristics of the semiconductor device.

FIG. 7 is a graph illustrating the characteristics of the semiconductor device.

FIG. 7 illustrates a change (shift) in the flat band voltage when a positive bias voltage is applied. In the first to third samples SP1 to SP3, a positive bias voltage of +15 V is applied to the first electrode 51. The temperature at the time of application is 150° C. The flat band voltage changes with the passage of time for applying the positive bias voltage. The horizontal axis of FIG. 7 is time tm. The vertical axis of FIG. 7 is the difference dVFB3 from the initial value of the flat band voltage as measured at 150° C.

As shown in FIG. 7, the flat band voltage does not substantially change in the third sample SP3 ($SiO_2$). Alternatively, the flatband voltage shifts slightly in the positive direction. In the second sample SP2 (Si-rich AlSiO), the flat band voltage shifts in the negative direction. The degree of shift is small. In the first sample SP1 (Al-rich AlSiO), the flat band voltage largely shifts in the negative direction.

It is considered that the shift of the flat band voltage when the positive bias voltage is applied is caused by, for example, the movable charge. It is considered that when the composition ratio of Si is high, for example, movable charges (for example, ions) can be suppressed.

Since the first insulating portion 41a includes $SiO_2$ or Si-rich AlSiO, the shift of the flat band voltage when a positive bias voltage is applied can be suppressed. Since the first insulating portion 41a includes the second insulating region r2, the shift of the flat band voltage can be suppressed. Since the first insulating portion 41a includes the third insulating region r3, the shift of the flat band voltage can be further suppressed.

Figure 8:
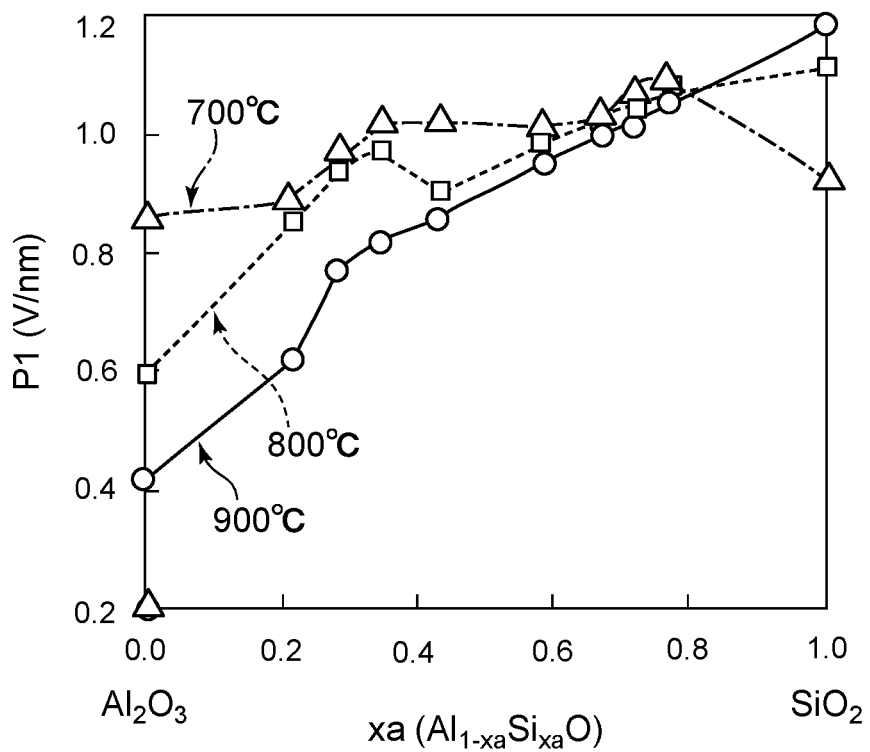
FIG. 8 is a graph illustrating the characteristics of the semiconductor device.

FIG. 8 is a graph illustrating the characteristics of the semiconductor device.

FIG. 8 illustrates the characteristics when the first insulating portion 41a is $Al_{1-xa}Si_{xa}O$. The horizontal axis of FIG. 7 is the composition ratio xa. The vertical axis is the evaluation parameter P1 regarding the breakdown voltage. The evaluation parameter P1 is a ratio of the breakdown voltage to the thickness of the first insulating portion 41a. FIG. 8 illustrates the properties of heat treatment at 700° C., 800° C., or 900° C.

As shown in FIG. 8, when the composition ratio xa is low and the composition ratio of Al is high, the evaluation parameter P1 becomes small and the breakdown voltage becomes low. When the composition ratio xa is high and the composition ratio of Si is high, the evaluation parameter P1 becomes large and the breakdown voltage becomes high. It is considered that when the composition ratio of Si is high, for example, movable charges (for example, ions) can be suppressed.

For example, a high breakdown voltage can be obtained by including the high Si composition region (for example, the third insulating region r3) in the first insulating portion 41a.

Figure 9:
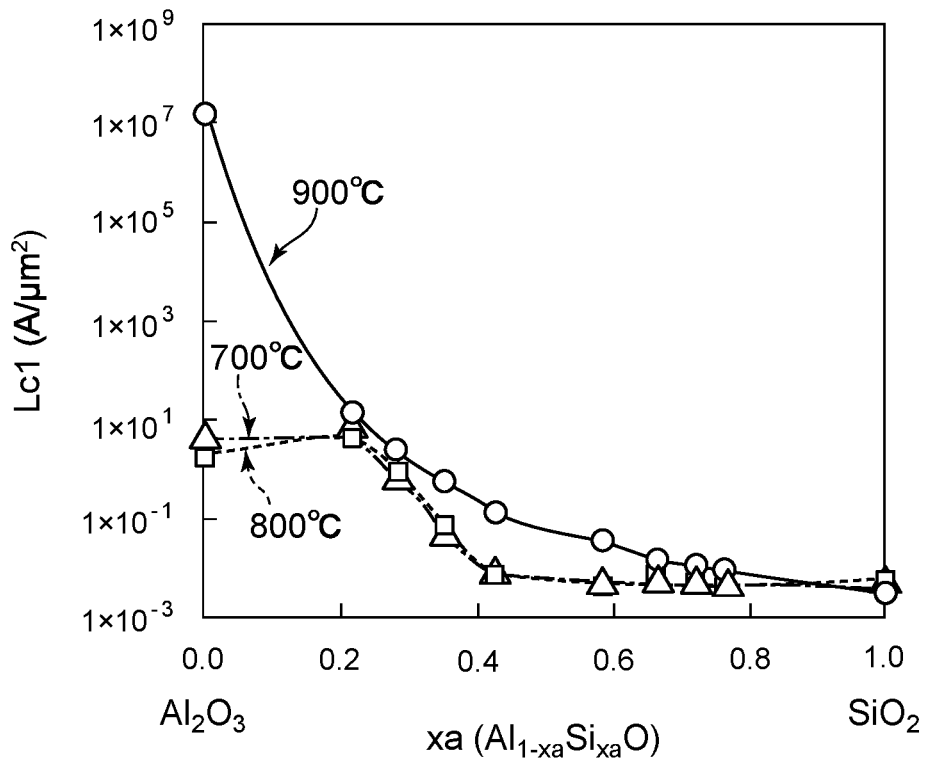
FIG. 9 is a graph illustrating the characteristics of the semiconductor device.

FIG. 9 is a graph illustrating the characteristics of the semiconductor device.

FIG. 9 illustrates the characteristics when the first insulating portion 41a is $Al_{1-xa}Si_{xa}O$. The horizontal axis of FIG. 9 is the composition ratio xa. The vertical axis is the leakage current density Lc1.

As shown in FIG. 9, when the composition ratio xa is low and the composition ratio of Al is high, the leak current density Lc1 becomes high. When the composition ratio xa is high and the composition ratio of Si is high, the leak current density Lc1 becomes low. It is considered that when the composition ratio of Si is high, for example, movable charges (for example, ions) can be suppressed. As a result, it is considered that a low leakage current density Lc1 can be obtained.

For example, when the first insulating portion 41a includes a high Si composition region (for example, the third insulating region r3), a low leakage current can be obtained.

Hereinafter, some examples relating to the first insulating portion 41a will be described.

Figure 10:
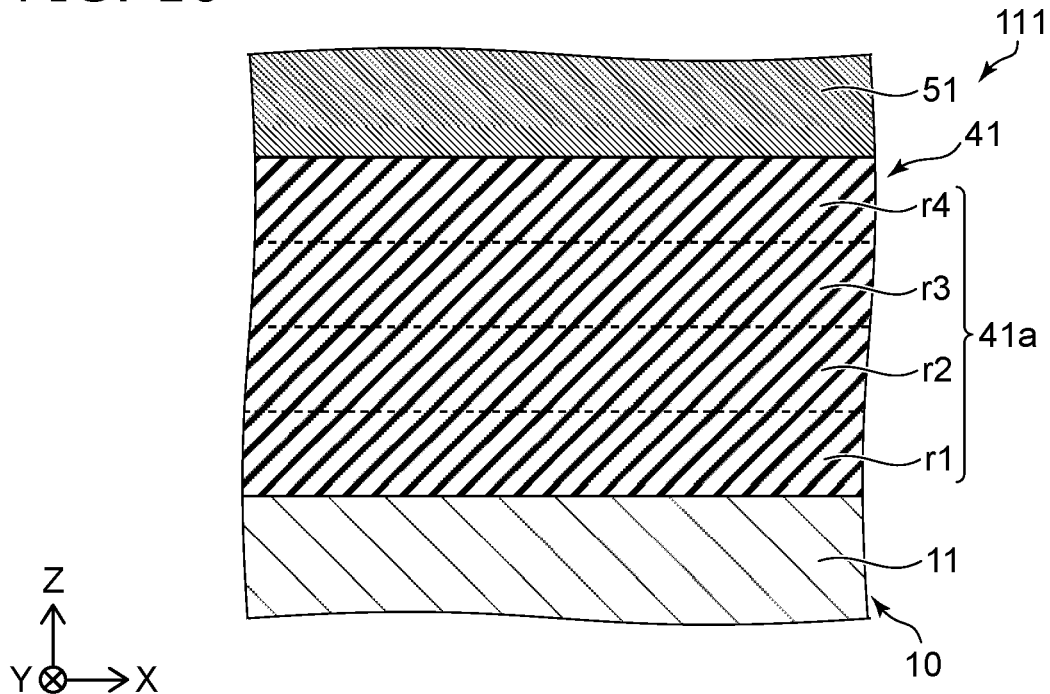
FIG. 10 is a schematic cross-sectional view illustrating the semiconductor device according to the first embodiment.

FIG. 10 is a schematic cross-sectional view illustrating the semiconductor device according to the first embodiment.

As shown in FIG. 10, in the semiconductor device 111 according to the embodiment, the first insulating portion 41a further includes the fourth insulating region r4. The fourth insulating region r4 is provided between the third insulating region r3 and the first electrode 51. The fourth insulating region r4 includes silicon, oxygen and nitrogen. The fourth insulating region r4 may include aluminum, silicon, oxygen and nitrogen. The third insulating region r3 does not include nitrogen. Alternatively, the composition ratio of nitrogen in the third insulating region r3 is lower than the composition ratio of nitrogen in the fourth insulating region r4. The fourth insulating region r4 includes, for example, O-rich AlSiON.

The first electrode 51 includes, for example, TiN. The first electrode 51 includes a portion facing the first insulating portion 41a. This opposing portion may include TiN. By providing the fourth insulating region r4 as described above, for example, higher stability can be obtained.

At least one of the nitrogen composition ratio or the oxygen composition ratio may be continuously changed between the third insulating region r3 and the fourth insulating region r4. Defects are suppressed and higher stability is obtained.

Figure 11:
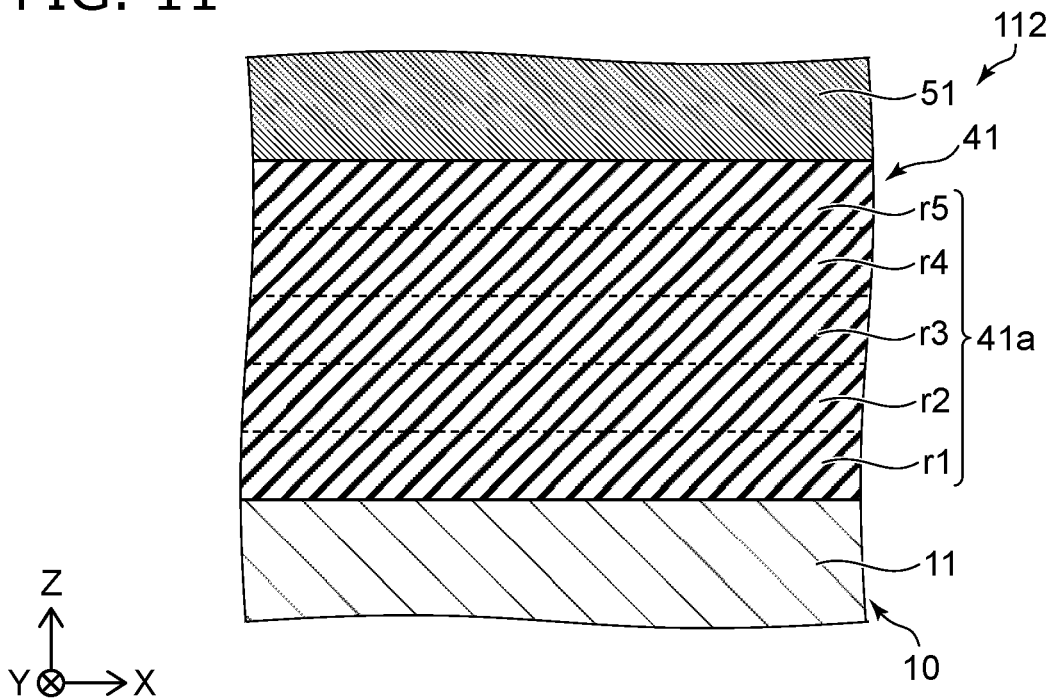
FIG. 11 is a schematic cross-sectional view illustrating the semiconductor device according to the first embodiment.

FIG. 11 is a schematic cross-sectional view illustrating the semiconductor device according to the first embodiment.

As shown in FIG. 11, in the semiconductor device 112 according to the embodiment, the first insulating portion 41a further includes the fifth insulating region r5. The fifth insulating region r5 is provided between the fourth insulating region r4 and the first electrode 51. The fifth insulating region r5 includes silicon, oxygen and nitrogen. The fifth insulating region r5 may include aluminum, silicon, oxygen and nitrogen. The composition ratio of nitrogen in the fifth insulating region r5 is higher than the composition ratio of nitrogen in the fourth insulating region r4. By providing the fifth insulating region r5 as described above, for example, higher stability can be obtained.

At least one of the nitrogen composition ratio or the oxygen composition ratio may be continuously changed between the fourth insulation region r4 and the fifth insulation region r5. Defects are suppressed and higher stability is obtained.

Figure 12:
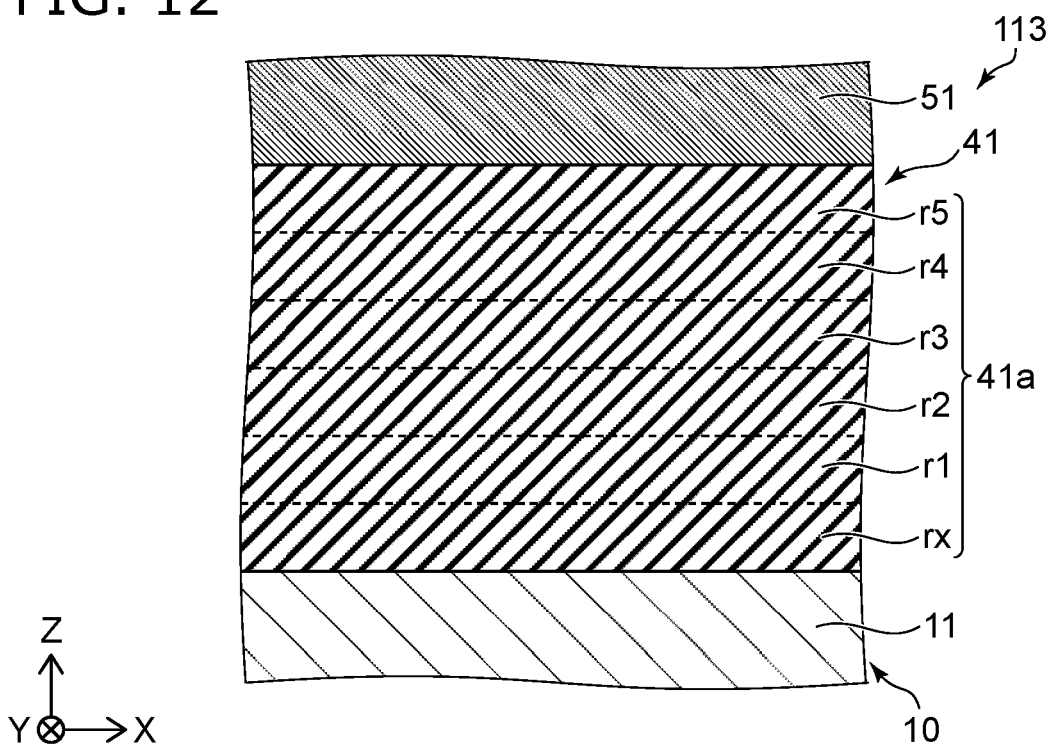
FIG. 12 is a schematic cross-sectional view illustrating the semiconductor device according to the first embodiment.

FIG. 12 is a schematic cross-sectional view illustrating the semiconductor device according to the first embodiment.

As shown in FIG. 12, in the semiconductor device 113 according to the embodiment, the first insulating portion 41a includes an intermediate region rx. The intermediate region rx is provided between the first partial region 11 and the first insulating region r1. The intermediate region rx includes aluminum and nitrogen. The intermediate region rx includes, for example, AlN. In one example, the composition ratio of aluminum in the intermediate region rx is higher than the composition ratio of aluminum in the first insulating region. Even when the intermediate region rx is provided, for example, high stability with respect to a change in frequency can be obtained. For example, high stability is obtained with respect to changes in temperature.

Such an intermediate region rx may be applied to any of the semiconductor devices 110 to 112.

Second Embodiment

Figure 13A:
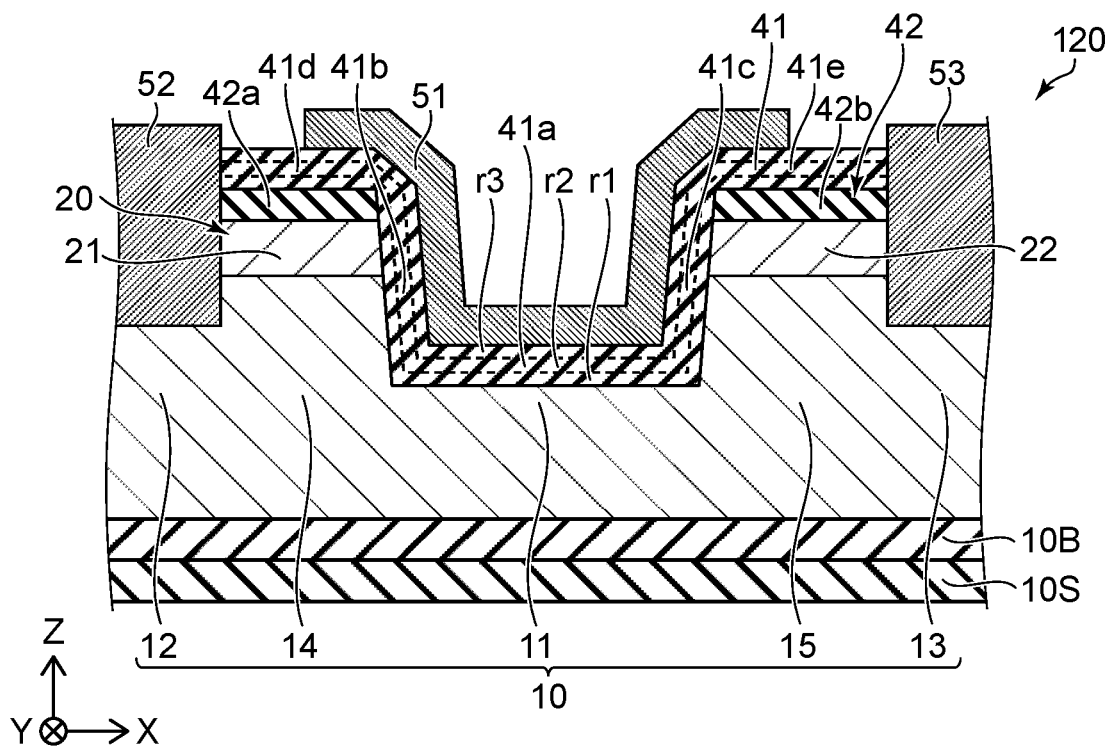
FIGS. 13A and 13B are schematic cross-sectional views illustrating the semiconductor device according to the first embodiment.
Figure 13B:
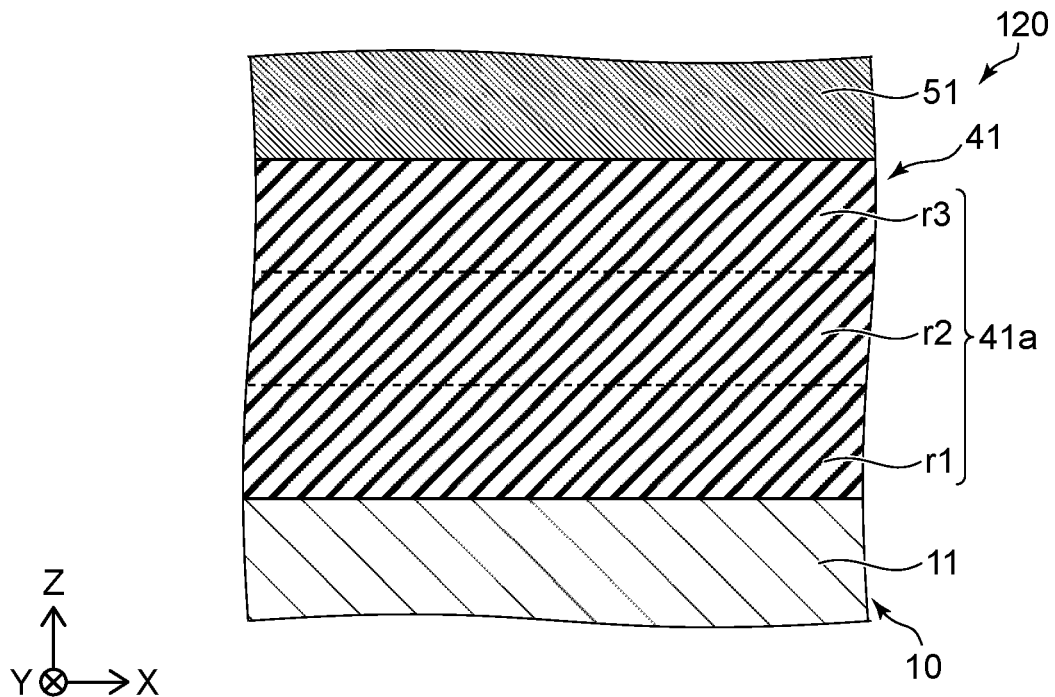

FIGS. 13A and 13B are schematic cross-sectional views illustrating the semiconductor device according to the first embodiment.

FIG. 13B is an enlarged view of FIG. 13A.

As shown in FIG. 13A, the semiconductor device 120 according to the embodiment includes a first semiconductor region 10, a first electrode 51, and a first insulating member 41.

Also in the semiconductor device 120, the first semiconductor region 10 includes $Al_{x1}Ga_{1-x1}N$ ($0 \le x1 < 1$). The first semiconductor region 10 includes the first partial region 11. The first insulating member 41 includes a first insulating portion 41a. The first insulating portion 41a is provided between the first partial region 11 and the first electrode 51. The first insulating portion 41a includes a first insulating region r1 and a second insulating region r2. The second insulating region r2 is provided between the first insulating region r1 and the first electrode 51.

In the semiconductor device 120, the first insulation region r1 includes $Al_{1-x1}Si_{x1}O_{y1}N_{1-y1}$ ($x1 < 0.5$, $y1 < 0.5$). The second insulating region r2 includes $Al_{1-x2}Si_{x2}O_{y2}N_{1-y2}$ ($0.5 < x2$, $0.5 < y2$). With such a configuration, for example, high stability with respect to changes in frequency can be obtained. For example, high stability is obtained with respect to changes in temperature. It is possible to provide a semiconductor device capable of obtaining stable characteristics.

In the semiconductor device 120, at least one of the aluminum composition ratio, the silicon composition ratio, the oxygen composition ratio, or the nitrogen composition ratio may change continuously between the first insulation region r1 and the second insulation region r2. Defects are suppressed and more stable characteristics can be obtained.

As shown in FIGS. 13A and 13B, in the semiconductor device 120, the first insulating portion 41a may further include the above-mentioned third insulating region r3. In the semiconductor device 120, the first insulating portion 41a may further include at least one of the above-mentioned fourth insulating region r4, fifth insulating region r5, or intermediate region rx.

According to the embodiment, it is possible to provide a semiconductor device whose characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, conductive members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first semiconductor region including $Al_{z1}Ga_{1-z1}N$ ($0 \le z1 < 1$), the first semiconductor region including a first partial region;
    a first electrode;
    a first insulating member including a first insulating portion provided between the first partial region and the first electrode, the first insulating portion including a first insulating region and a second insulating region, the second insulating region being provided between the first insulating region and the first electrode, the first insulating region including $Al_{1-x1}Si_{x1}O$ (x1<0.5), and the second insulating region including $Al_{1-x2}Si_{x2}O$ (0.5<x2).

2. The device according to claim 1, wherein at least one of a composition ratio of aluminum or a composition ratio of silicon changes continuously between the first insulating region and the second insulating region.

3. A semiconductor device comprising:
a first semiconductor region including $Al_{x1}Ga_{1-x1}N$ (0≤x1<1), the first semiconductor region including a first partial region;
a first electrode;
a first insulating member including a first insulating portion provided between the first partial region and the first electrode, the first insulating portion including a first insulating region and a second insulating region, the second insulating region being provided between the first insulating region the first electrode, the first insulating region including $Al_{1-x1}Si_{x1}O_{y1}N_{1-y1}$ (x1<0.5, y1<0.5), the second insulating region including $Al_{1-x2}Si_{x2}O_{y2}N_{1-y2}$ (0.5<x2, 0.5<y2).

4. The device according to claim 3, wherein
at least one of a composition ratio of aluminum, a composition ratio of silicon, a composition ratio of oxygen, or a composition ratio of nitrogen changes continuously between the first insulating region and the second insulating region.

5. The device according to claim 1, wherein the first insulating region is in contact with the first partial region.

6. The device according to claim 1, wherein
the first insulating portion further includes an intermediate region,
the intermediate region includes aluminum and nitrogen.

7. The device according to claim 1, wherein
the first insulating portion further includes a third insulating region,
the third insulating region is provided between the second insulating region and the first electrode,
the third insulating region includes silicon and oxygen, and
the third insulating region includes no aluminum, or a composition ratio of aluminum in the third insulating region is lower than a composition ratio of aluminum in the second insulating region.

8. The device according to claim 7, wherein at least one of a composition ratio of aluminum or a composition ratio of silicon continuously changes between the second insulating region and the third insulating region.

9. The device according to claim 7, wherein
the first insulating portion further includes a fourth insulating region,
the fourth insulating region is provided between the third insulating region and the first electrode,
the fourth insulating region includes silicon, oxygen and nitrogen,
the third insulating region includes no nitrogen, or a composition ratio of nitrogen in the third insulating region is lower than a composition ratio of nitrogen in the fourth insulating region.

10. The device according to claim 9, wherein
at least one of a composition ratio of nitrogen or a composition ratio of oxygen continuously changes between the third insulating region and the fourth insulating region.

11. The device according to claim 9, wherein
the first insulating portion further includes a fifth insulating region,
the fifth insulating region is provided between the fourth insulating region and the first electrode,
the fourth insulating region includes silicon, oxygen and nitrogen, and
a composition ratio of nitrogen in the fifth insulating region is higher than a composition ratio of nitrogen in the fourth insulating region.

12. The device according to claim 11, wherein
at least one of a composition ratio of nitrogen or a composition ratio of oxygen continuously changes between the fourth insulating region and the fifth insulating region.

13. The device according to claim 1, wherein at least one of the composition ratio of aluminum in the second insulating region or a composition ratio of silicon in the second insulating region repeatedly increases and decreases in a direction from the first partial region to the first electrode.

14. The device according to claim 1, wherein at least one of the composition ratio of aluminum in the first insulating region or a composition ratio of silicon in the first insulating region repeatedly increases and decreases in a direction from the first partial region to the first electrode.

15. The device according to claim 1, further comprising:
a second electrode;
a third electrode; and
a second semiconductor region including $Al_{z2}Ga_{1-z2}N$ (z1<z2≤1),
a direction from the second electrode to the third electrode being along the first direction,
a position of the first electrode in the first direction being between a position of the second electrode in the first direction and a position of the third electrode in the first direction,
the first semiconductor region further including a second partial region, a third partial region, a fourth partial region, and a fifth partial region,
a direction from the second partial region to the second electrode being along the second direction crossing the first direction,
a direction from the third partial region to the third electrode being along the second direction,
a position of the fourth partial region in the first direction being between a position of the second partial region in the first direction and a position of the first partial region in the first direction,
a position of the fifth partial region in the first direction being between the position of the first partial region in the first direction and a position of the third partial region in the first direction,
the second semiconductor region including a first semiconductor portion and a second semiconductor portion,
a direction from the fourth partial region to the first semiconductor portion being along the second direction,
a direction from the fifth partial region to the second semiconductor portion being along the second direction.

16. The device according to claim 15, further comprising:
a second insulating member including silicon and nitrogen,
the first semiconductor portion being located between the fourth partial region and a part of the second insulating member in the second direction,
the second semiconductor portion being located between the fifth partial region and an other part of the second insulating member in the second direction.

17. The device according to claim 15, wherein at least a part of the first insulating portion is between the fourth partial region and the fifth partial region in the first direction.

18. The device according to claim 15, wherein at least a part of the first electrode is located between the fourth partial region and the fifth partial region in the first direction.

19. The device according to claim 15, wherein
the first insulating member further includes a second insulating portion and a third insulating portion,
a part of the second insulating portion is located between the fourth partial region and the first electrode in the first direction, and
a part of the third insulating portion is located between the first electrode and the fifth partial region in the first direction.

20. The device according to claim 16, wherein
the first insulating member further includes a fourth insulating portion and a fifth insulating portion,
the part of the second insulating member is between the first semiconductor portion and the fourth insulating portion, and
the other part of the second insulating member is between the second semiconductor portion and the fifth insulating portion.

* * * * *